United States Patent [19]

Ito et al.

[11] Patent Number: 5,079,089
[45] Date of Patent: Jan. 7, 1992

[54] MULTI CERAMIC LAYER-COATED METAL PLATE AND PROCESS FOR MANUFACTURING SAME

[75] Inventors: Wataru Ito; Shumpei Miyajima; Misao Hashimoto, all of Kawasaki; Isao Itoh; Tadashi Komori, both of Hikari, all of Japan

[73] Assignee: Nippon Steel Corporation, Tokyo, Japan

[21] Appl. No.: 385,413

[22] Filed: Jul. 26, 1989

[30] Foreign Application Priority Data

Jul. 28, 1988 [JP] Japan ................. 63-186940

[51] Int. Cl.$^5$ ............................................. B32B 9/00
[52] U.S. Cl. ..................... 428/336; 428/213; 428/216; 428/332; 428/334; 428/457; 428/469; 428/472; 428/472.2; 428/698; 428/701; 428/702; 428/704
[58] Field of Search ............ 428/457, 469, 472, 472.2, 428/332, 334, 336, 216, 213, 698, 701, 702, 704, 446

[56] References Cited

U.S. PATENT DOCUMENTS

| | | | |
|---|---|---|---|
| Re. 29,420 | 9/1977 | Lindstrom et al. | 428/336 |
| Re. 32,111 | 5/1986 | Lambert et al. | 428/216 |
| 3,955,038 | 5/1976 | Lindstrom et al. | 428/457 |
| 3,958,070 | 5/1976 | Schintlmeister et al. | 428/457 |
| 4,079,163 | 3/1978 | Tanaka et al. | 428/457 |
| 4,226,082 | 10/1980 | Nishida | 428/627 |
| 4,237,184 | 12/1980 | Gonseth et al. | 428/336 |
| 4,252,862 | 2/1981 | Nishida | 428/457 |
| 4,401,719 | 8/1983 | Kobayashi et al. | 428/472 |
| 4,480,010 | 10/1984 | Sasanuma et al. | 428/698 |
| 4,495,254 | 1/1985 | Hoffman | 428/334 |
| 4,517,217 | 5/1985 | Hoffman | 428/469 |
| 4,533,605 | 8/1985 | Hoffman | 428/469 |
| 4,640,869 | 2/1987 | Loth | 428/469 |
| 4,643,952 | 2/1987 | Kurakata | 428/472 |

FOREIGN PATENT DOCUMENTS

| | | |
|---|---|---|
| 31805 | 7/1981 | European Pat. Off. . |
| 0106817 | 4/1984 | European Pat. Off. . |
| 239852 | 1/1979 | France . |
| 54-66385 | 5/1979 | Japan . |
| 54-85214 | 7/1979 | Japan . |
| 2192196 | 1/1988 | United Kingdom . |

OTHER PUBLICATIONS

Buhl et al., "TiN Coating on Steel", Thin Solid Films 80 (1981) pp. 265-270.
Patent Abstracts of Japan, vol. 7, No. 155 (C-175) [1300] Jul. 7, 1983.
Patent Abstract of Japan, vol. 7, No. 159 (M-228) [1304] Jul. 13, 1983.

Primary Examiner—Henry F. Epstein
Assistant Examiner—Archene A. Turner
Attorney, Agent, or Firm—Wenderoth, Lind & Ponack

[57] ABSTRACT

A metal plate is given an excellent decorative color by a multi-ceramic coating of a colored ceramic layer formed over the metal plate, the colored ceramic layer being made of at least one selected from the group consisting of nitrides and carbides of titanium, zirconium, hafnium, chromiun, niobium and aluminum and having a thickness of 0.1 μm to 1 μm ; and a transparent ceramic layer formed over the colored ceramic layer, the transparent ceramic layer being made of at least one of the group consisting of silicon oxide, silicon nitride and aluminum oxide and having a thickness of 0.1 μm to 5 μm. The depositions of the colored and transparent ceramic layers are effected by a dry process, and the order of deposition of the colored and transparent ceramic layers can be reversed.

9 Claims, 1 Drawing Sheet

MULTI CERAMIC LAYER-COATED METAL PLATE AND PROCESS FOR MANUFACTURING SAME

BACKGROUND OF THE INVENTION

1. Field of the Invention

The present invention relates to a multi ceramic layer-coated metal plate and a process for manufacturing the same. The multi ceramic layer-coated metal plate of the present invention is weather resistant and provides a pleasing decorative effects when used in interior decoration and for buildings and automobiles, etc.

2. Description of the Related Art

Due to the development and growth of electronics technologies, dry processes such as physical vapor depositions and chemical vapor depositions can be now applied to an improvement of the surfaces of metal materials. Namely, it is now possible to provide metal materials with a ceramic coating, which cannot be done except for an oxide by a wet process, a typical example being the electroplating of the processes of the prior art, and to provide the metal materials with a weather resistance, abrasion resistance, decorative appearance, and infra-red characteristic.

Nevertheless, it is still difficult to replace the wet process with the dry process on an industrial scale, except for products with superior functions, because the dry process is not suitable for mass production and has problems of high running costs and expensive apparatus.

Only one example of commercial success in the field of decoration is known, i.e., the gold color coating of titanium nitride on watches. This gold color coating is successful because it provides a watch with a high quality appearance. Nevertheless, it is still difficult to provide other colors by a dry deposition of a ceramic coating, because there are not many ceramic materials having a material color, and currently only gold, black, gray, etc. can be obtained by the dry process.

Nevertheless, it is known that various colors can be obtained by an interference color caused by an interference in the light in a coating (see, for example, Japanese Unexamined Patent Publication (Kokai) Nos. 54-66385 and 54-85214). But the obtained colors vary greatly depending on the angle of view, and thus their value as a decorative product is low. Further, an extremely precise control of the uniformity of the thickness of a coating is required to obtain a uniform color, because the color varies in accordance with the thickness of the coating, and in practice, this means that the above coating cannot be applied to a product having a large area, such as a part of a building.

Further, although ceramic coatings providing a color as described above are resistant to weather, corrosion, abrasion, and so on, due to use of ceramics, these resistances are not high enough for applications such as parts of building and automobiles, etc.

SUMMARY OF THE INVENTION

The object of the present invention is to solve the above prior art problems and to provide a decorative ceramic coating with a wide variety of colors which are uniform even over a large area and having a higher resistance to weather, corrosion, and abrasion, etc., and thus suitable for use for parts of a building and automobiles, etc.

The above and other objects and features are obtained according to the present invention, by a multi ceramic layer-coated metal plate comprising: a metal plate, in particular of stainless steel; a colored ceramic layer formed over and adjacent to the metal plate, the colored ceramic layer being made of at least one selected from the group consisting of nitrides and carbides of titanium, zirconium, hafnium, chromium, niobium and aluminum, preferably titanium nitride or titanium carbide, and having a thickness of 0.1 $\mu$m to 1 $\mu$m, preferably 0.2 $\mu$m to 0.5 $\mu$m; and a transparent ceramic layer formed over and adjacent to the colored ceramic layer, the transparent ceramic layer being made of at least one of the group consisting of silicon oxide, silicon nitride, and aluminum oxide, and having a thickness of 0.1 $\mu$m to 5 $\mu$m.

According to the present invention, there is also provided a multi ceramic layer-coated metal plate comprising: a metal plate, in particular of stainless steel; a transparent ceramic layer formed over and adjacent to the metal plate, the transparent ceramic layer being made of at least one of the group consisting of silicon oxide, silicon nitride and aluminum oxide and having a thickness of 0.1 $\mu$m to 3 $\mu$m, preferably 0.1 $\mu$m to 1 $\mu$m; and a colored ceramic layer formed over and adjacent to the transparent ceramic layer, the colored ceramic layer being made of at least one selected from the group consisting of nitrides and carbides of titanium, zirconium, hafnium, chromium, niobium and aluminum and having a thickness of 0.1 $\mu$m to 1 $\mu$m, preferably 0.2 $\mu$m to 0.5 $\mu$m.

Further, according to the present invention, there is provided a process for manufacturing a multi ceramic layer-coated metal plate comprising the steps of: preparing a metal plate; dry depositing a colored ceramic layer over and adjacent to the metal plate, the colored ceramic layer being made of at least one selected from the group consisting of nitrides and carbides of titanium, zirconium, hafnium, chromium, niobium and aluminum and having a thickness of 0.1 $\mu$m to 1 $\mu$m; and dry depositing a transparent ceramic layer over and adjacent to the colored ceramic layer, the transparent ceramic layer being made of at least one of the group consisting of silicon oxide, silicon nitride, and aluminum oxide, and having a thickness of 0.1 $\mu$m to 5 $\mu$m.

Furthermore, according to the present invention, there is provided a process for manufacturing a multi ceramic layer-coated metal plate comprising the steps of: preparing a metal plate; dry depositing a transparent ceramic layer over and adjacent to the metal plate, the transparent ceramic layer being made of at least one of the group consisting of silicon oxide, silicon nitride and aluminum oxide and having a thickness of 0.1 $\mu$m to 3 $\mu$m; and dry depositing a colored ceramic layer over and adjacent to the transparent ceramic layer, the colored ceramic layer being made of at least one selected from the group consisting of nitrides and carbides of titanium, zirconium, hafnium, chromium, niobium, and aluminum, and having a thickness of 0.1 $\mu$m to 1 $\mu$m.

DESCRIPTION OF THE PREFERRED EMBODIMENTS

Figure 1:
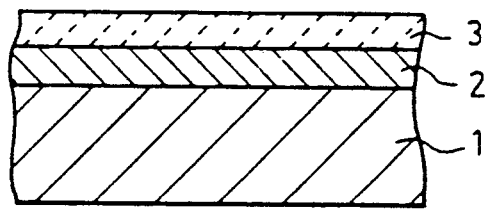
FIG. 1 is a cross-sectional view of a first embodiment of a multi ceramic layer-coated metal plate according to the present invention; and, FIG. 2 is a cross-sectional view of a second embodiment of a multi ceramic layer-coated metal plate according to the present invention.
Figure 2:
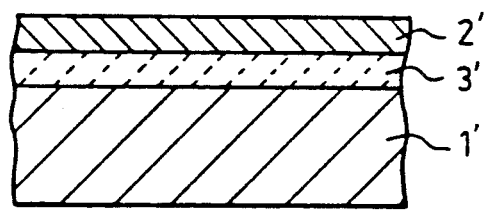

FIG. 1 illustrates an embodiment of a multi ceramic layer-coated metal plate, in which the reference numeral 1 denotes for a metal plate, 2 a colored ceramic layer over the metal plate, and 3 a transparent ceramic layer over the colored ceramic layer. FIG. 2 illustrates another embodiment of a multi ceramic layer-coated metal plate, in which the reference numeral 1 denotes a metal plate, 2' a transparent ceramic layer over the metal layer, and 3' a colored ceramic layer over the transparent ceramic layer. As seen in these figures, the order of coating a metal plate with a colored ceramic layer and a transparent ceramic layer may be reversed depending on the usage of the coated metal plate. Furthermore, these multi ceramic layers may be coated on both main surfaces of a metal plate, if desired, in each embodiment.

The extremely decorative color of the ceramic coating layer of a metal plate is obtained according to the present invention by providing a basic color, which is a material color of a colored ceramic layer, as a primary layer, in combination with a transparent ceramic layer formed over the colored ceramic layer, by which an interference color depending on the thickness of the transparent ceramic layer is mixed with the basic material color of the colored ceramic layer so that the color is delicately varied around the basic material color of the colored ceramic layer. In this combination of coating layers, a greater variety of the colors is obtained and the problem of an interference color in that the color is easily varied in accordance with the angle of view is removed. Also, a color with a transparent look is obtained according to the present invention by a combination of a colored ceramic layer and a transparent ceramic layer having a relatively thick thickness and not providing an interference color.

Furthermore, the transparent ceramic layer has a higher hardness and a higher corrosion resistance, and therefore, protects metal plate environmental damage, for example, impact by gravel, etc. in the case of a part of a building. Namely, it provides the metal plate with a high weather and abrasion resistance.

Sometimes an interference color is not desired and a higher weather and corrosion resistance is required. In such a case, a combination of a transparent ceramic layer as a primary layer and a colored ceramic layer applied over the transparent ceramic layer can be advantageously utilized. The transparent ceramic layer as a primary layer protects the metal plate from weather and corrosion, etc., although formed under the colored ceramic layer which provides a desired color.

The kind of the metal plate used is not particularly limited and includes stainless steel, titanium, copper, steel, and aluminum, etc., but steel and stainless steel are particularly preferred due to the general use thereof. The present invention is particularly directed to a metal plate with a large area and used for, for example, buildings, and automobiles, etc. The metal plate is preferably in the form of a ribbon or coil and can have an area of, for example, 370 mm width and 300 m length, etc., i.e., a width of several tens centimeters or more and a length of any length.

The colored ceramic layer is made of at least one selected from the group consisting of nitrides and carbides of titanium, zirconium, hafnium, chromium, niobium and aluminum, having a material color. The thickness of the colored ceramic layer is from 0.1 to 1 $\mu$m. A thickness of less than 0.1 $\mu$m does not provide a sufficient color as a material color. At a thickness of 1 $\mu$m, a desired color is obtained, but, at a higher thickness, the adhesion of the colored ceramic layer to the metal plate may be disadvantageously reduced. Preferably, the thickness is 0.2 to 0.5 $\mu$m. A thickness of 0.2 $\mu$m or more provides a definite material color, but a thickness of 0.5 $\mu$m or more is disadvantageous from the standpoint of costs.

The transparent ceramic layer used is made of at least one selected from the group consisting of silicon oxide, silicon nitride and aluminum oxide. The thickness of the transparent ceramic layer is from 0.1 to 5 $\mu$m. A thickness of less than 0.1 $\mu$m does not provide a sufficient protection for the metal plate and a thickness of more than 5 $\mu$m may cause a loss of adhesion of the transparent ceramic layer to the colored ceramic layer. The above thickness of the transparent ceramic layer can be divided into two ranges. The first range of the thickness is 0.1 to 3 $\mu$m, which provides a decorative metal plate utilizing an interference color, and as described above, a variety of excellent decorative colors can be obtained by this range of the thickness. The second range of the thickness is 3 to 5 $\mu$m, which avoids an interference color and provides a decorative color with a transparent look.

When the transparent ceramic layer is used as a primary layer and a colored ceramic layer covers the transparent ceramic layer, the thickness of the transparent ceramic layer is preferably 0.1 to 3 $\mu$m, because a thickness of more than 3 $\mu$m may decrease the adhesion of the transparent ceramic layer to the metal plate.

In accordance with the present invention, the colored and transparent ceramic layers are formed by a dry deposition process, i.e., physical vapor deposition or chemical vapor deposition. A wet process for forming a layer of oxides of aluminum, zirconium, titanium, silicon, and so on is known but is disadvantageous for the purpose of the present invention. The wet process comprises pyrolysis of an alcohol solution of alkoxide or acetyl acetonate of aluminum, zirconium, titanium, silicon, etc., and although this process provides some weather and corrosion resistance, it is not satisfactory because the obtained layer is very porous due to the pyrolysis. Further, control of the layer thickness is difficult. The dip-in and pull-out method provides a most uniform layer, but the thickness of the obtainable layer is strictly determined by the viscosity of the solution and the kind of substrate, and therefore, there is no guarantee that a thickness providing a sufficiently improved weather and corrosion resistance can be obtained. The other methods for applying the solution, such as spraying, roll coating, and spin coating, allow a rough control of the layer thickness but do not provide a layer with a uniform thickness and a layer with a non-uniform thickness tends to be corroded at a thin thickness portion thereof and does not provides a uniform coloration.

A preferred dry process for forming the colored ceramic layer is ion plating or sputtering. In a multilayer having a plurality of interfaces, the adhesion of the layers is important, and the ion plating provides a layer with a good adhesion at a high productivity. To improve the color quality of the colored ceramic layer, the stoichiometric ratio of a metal such as titanium, zirconium, chromium, niobium, and aluminum to nitrogen or carbon in the deposited layer must be precisely controlled, and sputtering enables a deposition of a layer with a composition of a stoichiometric ratio.

Therefore, preferably the colored ceramic layer is formed by ion plating or sputtering, but more preferably, first a portion of the layer adjacent to the underlying layer (the metal plate or the transparent layer) is formed by ion plating, to increase the adhesion to the underlying layer, and then a portion of the layer adjacent to the overlying layer (the transparent layer), if present, is formed by sputtering, to precisely control the stoichiometric ratio of a metal such as titanium, zirconium, chromium, niobium, or aluminum to nitrogen or carbon and obtain a high quality color.

A preferred dry process for forming the transparent ceramic layer is plasma CVD or sputtering. The plasma CVD provides a dense layer, which avoids a scattering of the light in the layer and provides an excellent interference or transparent layer as well as allowing a great improvement of the weather and corrosion resistance by preventing corrosion of the underlying metal plate due to microdefects such as pitching. Sputtering does not provide as dense a layer as that provided by plasma CVD and does not improve the weather and corrosion resistance of the layer as much as plasma CVD; but it still improves the weather resistance and allows a relatively easy formation of the layer because it does not need a gas such as silane, which is difficult to handle, as in plasma CVD.

The colored and transparent ceramic layers are preferably formed successively without breaking a vacuum. If the metal plate is taken out of a vacuum chamber into air during the formation of the two layers, components of the air, particularly oxygen and water, remain in the layers and thus the interface between the two layers is separated and the adhesion therebetween is reduced.

Preferably, the colored and transparent ceramic layers are preferably formed successively in a same chamber. If the colored and transparent ceramic layers are formed separately in different chambers, the temperature of the metal plate is raised and lowered and stress is generated inside the layers or cracks appear in the layers due to a repeated increase and decrease of the stress, which causes a loss of the adhesion of the primary layer to the metal plate.

The colored and transparent ceramic layers can be formed onto a continuous ribbon or strip of a metal supplied from and taken-up by rolls in the form of a coil.

The present invention will be described in more detail with reference to the following examples.

EXAMPLE 1

A successive coating machine was used which comprised a cleaning mechanism, and an ion plating, a sputtering, and a plasma CVD apparatuses in series between coil-supply and coil-take-up mechanisms. On a ferrite-type stainless steel in the form of a coil with a width of 370 mm and a length of 300 m, a first layer of titanium nitride, 0.5 $\mu$m thick, was deposited by sputtering, and successively a second layer of silicon oxide, 0.2 $\mu$m thick, was deposited on the titanium nitride layer by plasma CVD. The metal plate was a SUS430BA plate, not heated. Before the depositions, the metal plate was treated with an ion bombardment by argon gas as a primer treatment, in a clean room. The depositions were carried out at a RF power of 1 kW and under $5 \times 10^{-3}$ Torr by magnetron sputtering. For the titanium nitride deposition, a titanium target was used and argon and nitrogen were introduced (reaction sputtering). For the silicon oxide deposition, a silicon oxide target was used and, silane (SiH$_4$) and nitrogen suboxide (N$_2$O) were introduced with evacuating to a pressure of $1 \times 10^{-1}$ atm. The color of the obtained bi-layered coating was slightly different from the gold color of the titanium nitride in that it was more yellow.

The same procedures were repeated and the thickness of the silicon oxide layer was varied with a fixed thickness of the titanium nitride layer of 0.5 $\mu$m. The results were summarized using a commercial colorimeter and the L*, a*, b* method in Table 1.

TABLE 1

| Sample No. | Thickness of SiO$_2$ (Å) | Deposition conditions and color of SiO$_2$/TiN coating | | | | Apparent color (for reference) |
|---|---|---|---|---|---|---|
| | | Thickness of TiN (Å) | L* | a* | b* | |
| 862 | 818 | ca. 5000 | 54.0 | 4.6 | 17.1 | light gold |
| 863 | 1651 | ca. 5000 | 67.0 | −0.4 | 35.0 | bright yellow |
| 864 | 2684 | ca. 5000 | 53.1 | 16.8 | 9.4 | reddish orange |
| 865 | 3957 | ca. 5000 | 61.9 | 4.7 | 50.1 | dark yellow |
| 866 | 7875 | ca. 5000 | 60.8 | −5.3 | 30.6 | yellowish green |
| 867 | 0 | ca. 5000 | 63.6 | 3.6 | 27.7 | light gold (TiN) |

A weather resistance test was effected and the stainless steel with only a titanium nitride layer exhibited a weather resistance almost the same as that of the stainless steel alone (see Comparable Example 1 in Table 3). In comparison, the samples with titanium nitride and silicon oxide layers exhibited a 24 times longer life against rust than that of the stainless steel only.

To estimate the abrasion resistance of the samples, the surface hardness was measured by a microhardness meter with a triangle probe. The hardness of the stainless steel without a ceramic coating was 270 kg/mm$^2$, and the hardness of the samples with titanium nitride and silicon oxide layers was considerably improved to 1000 kg/mm$^2$.

EXAMPLE 2

The procedures of Example 1 were repeated except that the thickness of the silicon oxide layer was changed to 3.5 $\mu$m.

The color of the coating was the gold color of the titanium nitride per se. The color difference between the layers of titanium nitride per se and SiO$_2$/TiN was $\Delta = 1.78$, which is almost the same as the limit distinguishable by the naked eye.

EXAMPLE 3

To a ferrite-type stainless steel plate, 0.5 mm thick, in the form of a coil, a first layer of titanium carbide, 0.5 $\mu$m thick, by ion plating, and a second layer of silicon dioxide, 0.2 $\mu$m thick, by plasma CVD, were laminated.

The color of the resultant coating was a uniform dark green.

The same procedures were repeated and the thickness of the silicon dioxide layer was varied with a fixed thickness of the silicon carbide layer of 0.5 μm. Delicate differences of colors were observed among the resultant coatings.

slightly different from the gold color of hafnium nitride, in that it was more yellow.

The results were summarized using a commercial colorimeter and the L*, a*, b* method in Table 2. As seen from Table 2, the combination of HfN/SiO$_2$ showed almost the same trends as the combination of TiN/SiO$_2$.

TABLE 2

| Sample No. | Deposition conditions and color of SiO$_2$/HfN coating | | | | | |
|---|---|---|---|---|---|---|
| | Thickness of SiO$_2$ (Å) | Thickness of HfN (Å) | L* | a* | b* | Apparent color (for reference) |
| 782 | 856 | ca. 10000 | 55.2 | 3.7 | 18.5 | light gold |
| 783 | 1540 | ca. 10000 | 66.7 | 0.1 | 33.8 | bright gold |
| 784 | 2602 | ca. 10000 | 53.0 | 17.8 | 10.2 | reddish orange |
| 785 | 3932 | ca. 10000 | 60.1 | 4.0 | 47.7 | dark gold |
| 786 | 7723 | ca. 10000 | 58.9 | −6.0 | 32.1 | yellowish green |
| 787 | 0 | ca. 10000 | 63.5 | 2.7 | 28.3 | gold |

In a weather resistance test, the stainless steel with only a silicon carbide layer had a remarkably lowered weather resistance, and the rust resistance life thereof was about half that of the stainless steel surface (see Comparable Example 2, in Table 2). By applying a silicon dioxide layer over the silicon carbide layer, the rust resistance was increased to be equal to or more than that of the silicon carbide surface.

EXAMPLE 4

To a ferrite-type stainless steel plate, 0.5 mm thick, in the form of a coil, a first layer of hafnium nitride, 0.5 μm thick, by ion plating, and a second layer of silicon dioxide, 0.2 μm thick, by plasma CVD, were successively laminated. The metal plate was a SUS430BA plate, not heated. The hafnium nitride layer was deposited by ion plating at 170 A and 7 × 10$^{-3}$ Torr with a hafnium evaporation source and nitrogen gas introduced. The silicon dioxide layer was deposited by plasma CVD at 1 × 10$^{-1}$ Torr with silane and nitrogen suboxide gases introduced. The color of the resultant coating was

EXAMPLE 5-19

The metal plates used were of stainless steel titanium, copper, normal steel, and aluminum. Various first and second layers were coated on the metal plates. The methods and the results of weather resistance tests thereof are shown in Table 3. The thickness of the first layer was 0.5 μm and the thickness of the second layer was 0.2 μm, in all cases. For Examples 1 to 15, the colors were a mixed color of a material color of first colored ceramic layers and an interference color of second transparent ceramic layers. For Examples 16 to 19, the colors were a material color of second colored ceramic layers.

As results of weather resistance tests, these materials showed at least twice as long a rust resistance life as that of the respective substrates.

TABLE 3

| Sample No. | Substrate | First layer | (method) | Second layer | (method) | Weather resistance | Note |
|---|---|---|---|---|---|---|---|
| 1 | SUS430BA | TiN | (SP) | SiO$_2$ | (CVD) | 5 | Example 1 |
| 2 | SUS430BA | TiN | (IP) | SiO$_2$ | (CVD) | 5 | Example 5 |
| 3 | SUS430BA | TiC | (IP) | SiO$_2$ | (CVD) | 3 | Example 3 |
| 4 | SUS430BA | TiN | (SP) | SiO$_2$ | (SP) | 4 | Example 6 |
| 5 | SUS430BA | TiN | (IP) | Si$_3$N$_4$ | (CVD) | 5 | Example 7 |
| 6 | SUS430BA | TiN | (SP) | Al$_2$O$_3$ | (SP) | 4 | Example 8 |
| 7 | SUS430BA | HfN | (SP) | SiO$_2$ | (CVD) | 5 | Example 4 |
| 8 | SUS430BA | ZrN | (SP) | SiO$_2$ | (CVD) | 5 | Example 9 |
| 9 | SUS430BA | CrN | (SP) | SiO$_2$ | (CVD) | 5 | Example 10 |
| 10 | SUS430BA | AlN | (SP) | SiO$_2$ | (CVD) | 5 | Example 11 |
| 11 | Titanium | TiC | (IP) | SiO$_2$ | (CVD) | 5 | Example 12 |
| 12 | Copper | TiN | (IP) | SiO$_2$ | (CVD) | 5 | Example 13 |
| 13 | Normal steel | TiN | (IP) | SiO$_2$ | (CVD) | 4 | Example 14 |
| 14 | Aluminum | TiN | (IP) | SiO$_2$ | (CVD) | 5 | Example 15 |
| 15 | SUS430BA | SiO$_2$ | (CVD) | TiN | (IP) | 5 | Example 16 |
| 16 | SUS430BA | Al$_2$O$_3$ | (SP) | TiN | (IP) | 4 | Example 17 |
| 17 | SUS430BA | SiO$_2$ | (CVD) | HfN | (SP) | 5 | Example 18 |
| 18 | SUS430BA | Al$_2$O$_3$ | (SP) | ZrN | (SP) | 4 | Example 19 |
| 20 | SUS430BA | TiN | (IP) | non | | 3 | Comparative Example 1 |
| 21 | SUS430BA | TiC | (IP) | non | | 2 | Comparative Example 2 |

Note
Methods of deposition were as follows:
SP: sputtering. IP: ion plating. CVD: plasma CVD.
The evaluation of the weather resistance is expressed as 5 steps of improvement of the rust resistance life in comparison with that of the substrate, as shown below:
5: 5 times or more, 4: 2-5 times, 3: same as substrate 2: ½-1/5, 1: less than 1/5.

We claim:
1. A multi ceramic layer-coated metal plate, comprising:

a stainless steel plate;

a colored ceramic layer formed over and adjacent to the metal plate, the colored ceramic layer being made of at least one selected from the group consisting of nitrides and carbides of titanium, zirconium, hafnium, chromium, niobium and aluminum and having a thickness of 0.1 $\mu$m to 1 $\mu$m; and a transparent ceramic layer formed over and adjacent to the colored ceramic layer, the transparent ceramic layer being made of at least one of the group consisting of silicon oxide and silicon nitrides and having a thickness of 0.1 $\mu$m to 3 $\mu$m, whereby an interference color is provided to the metal plate.

2. The multi ceramic layer-coated metal plate according to claim 1, wherein the colored and transparent ceramic layers are ceramic layers formed by a dry deposition process.

3. The multi ceramic layer-coated metal plate according to claim 1, wherein the colored ceramic layer has a thickness of 0.2 $\mu$m to 0.5 $\mu$m.

4. The multi ceramic layer-coated metal plate according to claim 1, wherein the colored ceramic layer is made of titanium nitride or titanium carbide.

5. A multi ceramic layer-coated metal plate, comprising:

a stainless steel plate;

a transparent ceramic layer formed over and adjacent to the metal plate, the transparent ceramic layer being made of at least one of the group consisting of silicon oxide and silicon nitride and having a thickness of 0.1 $\mu$m to 3 $\mu$m; and a colored ceramic layer formed over and adjacent to the transparent ceramic layer, the colored ceramic layer being made of at least one selected from the group consisting of nitrides and carbides of titanium, zirconium, hafnium, chromium, niobium and aluminum and having a thickness of 0.1 $\mu$m to 1 $\mu$m.

6. The multi ceramic layer-coated metal plate according to claim 5, wherein the colored and transparent ceramic layers are ceramic layers made by a dry deposition process.

7. The multi ceramic layer-coated metal plate according to claim 5, wherein the colored ceramic layer has a thickness of 0.2 $\mu$m to 0.5 $\mu$m.

8. The multi ceramic layer-coated metal plate according to claim 5, wherein the colored ceramic layer is made of titanium nitride or titanium carbide.

9. The multi ceramic layer-coated metal plate according to claim 5, wherein the transparent ceramic layer has a thickness of 0.1 $\mu$m to 1 $\mu$m.

* * * * *